INVENTOR
Peter Bennett Helsdon
BY
Baldwin Wight Diller & Brown
ATTORNEYS 3,489,965
INSULATED GATE FIELD EFFECT TRANSISTORS Peter Bennett Helsdon, Chelmsford, England, assignor to The Marconi Company Limited, London, England, a British company Filed Mar. 29, 1968, Ser. No. 717,157
Claims priority, application Great Britain, Apr. 4, 1967, 15,377/67
Int. Cl. H01l 1/02, 3/00
U.S. Cl. 317—234 3 Claims

ABSTRACT OF THE DISCLOSURE

Known insulated gate field effect transistors are liable to destruction by stray static electricity and electric charges, since the gate insulation will break down irreversibly if the voltage on its rises above a certain value. This invention provides the insulated gate field effect transistor with a housing which is filled with gas at low pressure which will ionise at a lower voltage than the breakdown voltage of the insulation.

This invention relates to insulated gate field effect transistors.

Figure 1:
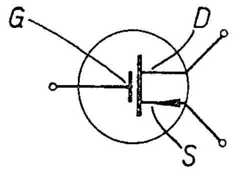

The insulated gate field effect transistor is now a well known device and is usually conventionally represented as shown in FIGURE 1 of the accompanying drawings.

It is a semi-conductor device having three electrodes known as the "gate," the "drain" and the "source" electrodes. These are indicated in FIGURE 1 by the references G, D and S respectively. As is well known, control of the output current of a field effect transistor is effected by control of the input voltage instead of, as is the case with an ordinary transistor, of the input current.

If the voltage on the gate of an insulated gate field effect transistor rises for any reason above a certain value the gate insulation, (an oxide layer on the semi-conductor body of the device) will break down irreversibly and the device will be destroyed. To quote practical figures the gate insulation of a typical known insulated gate field effect transistor may be designed to withstand from 70 to 130 volts but if the designed maximum voltage is exceeded, the gate insulation may break down and the transistor be destroyed. Accordingly known insulated gate field effect transistors are very liable to damage or destruction by stray static electricity and electro-static charges on the gate electrode—including charges produced by friction in normal handling—can easily damage or destroy such devices. In fact, because of this, it is common for the manufacturers of such devices to issue with them a warning that the electrode leads should be connected together when the device is not in use, and sometimes to provide a coiled spring for shorting together the connector pins of the device when it is not in use. The present invention seeks to provide improved insulated gate field effect transistors which shall be less liable to damage or destruction by stray electrostatic charges than are known comparable transistors.

According to this invention an insulated gate field effect transistor is housed in a housing which is filled with a low pressure filling of gas which will ionise at a voltage below the breakdown voltage of the gate insulation.

Preferably the gas is a mixture of inert and radio-active gases such as neon and tritium at a pressure and in a proportion like that normally used in a low voltage neon tube.

Figure 2:
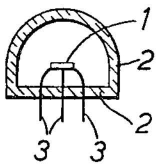

FIGURE 2 of the accompanying drawings illustrates the invention. Here 1 is an insulated gate field effect transistor which is suitably mounted in a housing 2 of glass or other suitable material into the base of which are fused connector pins 3 making necessary connections to the transistor. In accordance with this invention the housing 2 is filled with a gas mixture such as neon and tritium at the pressure within the range 50 mm. to 20 cm. of mercury and in the proportions ordinarily employed for the gas filling of a low voltage neon tube. The gas mixture is so chosen and its pressure is such that it will ionise at a voltage safely below the breakdown voltage of the gate electrode insulation. Accordingly stray electro-static voltage equal to or greater than said breakdown voltage will not occur on the gate electrode, since ionisation will occur first.

In the foregoing particular description and in FIGURE 2 is it assumed that only one insulated gate fiield effect transistor is in the gas filled housing. Obviously, however a number of such transistors, interconnected or not as may be desired, and with or without other circuit elements, may be mounted in the same gas-filled housing and will be all protected thereby if the gas filling is such as will ionise below the gate insulation breakdown voltage of the device having the lowest gate insulating breakdown voltage.

At normal operating voltages and in normal use the gas will not be ionised and will behave as an ordinary insulator not adversely affecting normal operation.

I claim:

1. An insulated gate field effect device comprising a transistor semi-conductor body, a pair of spaced apart electrodes connected to said transistor body defining a current channel therebetween, a gate electrode disposed over at least a portion of said channel with an insulator separating the gate electrode from the channel, a sealed housing containing a rarefied atmosphere of gas enclosing said transistor, said gas being voltage responsive ionizable at voltages below the breakdown voltage of said insulator.

2. A housed field effective device as claimed in claim 1 wherein the rarefied atmosphere is a mixture of inert and radio-active gases.

3. A housed field effective device as claimed in claim 2 wherein the rarefied atmosphere is a mixture of neon and tritium at a pressure within the range 50 mm. to 20 cm. of mercury.

References Cited

UNITED STATES PATENTS

| | | | |
|---|---|---|---|
| 2,793,331 | 5/1957 | Lamb | 317—235 |
| 2,887,629 | 5/1959 | Nijland et al. | 317—234 |
| 2,900,531 | 8/1959 | Wallmark | 317—235 X |
| 3,059,158 | 10/1962 | Daucette et al. | 317—234 |
| 3,244,947 | 4/1966 | Slater | 317—234 |
| 3,274,458 | 9/1966 | Bayer et al. | 317—234 |

JAMES D. KALLAM, Primary Examiner

U.S. Cl. X.R.

317—238